United States Patent
Palmisano et al.

(10) Patent No.: US 6,181,206 B1
(45) Date of Patent: Jan. 30, 2001

(54) LOW NOISE RF AMPLIFIER WITH PROGRAMMABLE GAIN

(75) Inventors: Giuseppe Palmisano, Catania; Salvatore Pennisi, Giarre, both of (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/338,400

(22) Filed: Jun. 22, 1999

(30) Foreign Application Priority Data

Jun. 23, 1998 (IT) .............................................. VA98A0013

(51) Int. Cl.[7] ...................................................... H03G 3/30
(52) U.S. Cl. ............................................. 330/278; 330/288
(58) Field of Search .................................. 330/278, 285, 330/288, 296, 302

(56) References Cited

U.S. PATENT DOCUMENTS 5,530,404 * 6/1996 Debroux ................................ 330/278
5,767,662 * 6/1998 Perkins ............................. 330/288 X
5,977,828 * 11/1999 Hu et al. ........................... 330/278 X

* cited by examiner

Primary Examiner—Steven J. Mottola
(74) Attorney, Agent, or Firm—Theodore E. Galanthay; Allen, Dyer, Doppelt, Milbrath & Gilchrist, P.A.

(57) ABSTRACT

By selecting a particular configuration of an input stage of a low noise RF amplifier, an optimal combination of linearity and input matching is achieved upon selecting a certain gain factor from a set of fixed step values. Each input stage configuration defines an input matching network specifically suitable to operate at a certain RF frequency. An RF signal input inductor is selectively associated to an input coupling capacitor, and a second degeneration inductor of a gain transistor of the input stage having a different gain value. The selection of a certain configuration is made through at least one switch through which a bias current generator is switched to the programmably selected input stage.

29 Claims, 3 Drawing Sheets

LOW NOISE RF AMPLIFIER WITH PROGRAMMABLE GAIN

FIELD OF THE INVENTION

The present invention relates to the field of electronics, and, more particularly to an amplifier.

BACKGROUND OF THE INVENTION

Low noise amplifiers (LNA) for multi-standard RF applications must operate in different frequency ranges, particularly with input signal dynamics that may be 90 dB or more. To avoid a rather costly approach of using several distinct amplifiers, with each amplifier having a selection switch external to the chip, it is necessary to overcome a number of problems deriving from the different operating frequencies, as well as from the extremely variable input signal dynamics.

To ensure an acceptable voltage standing wave ratio (VSWR), an amplifier requires a specific input matching adapting network. Such a network may normally be designed for a relatively narrow band, and optimized for a certain operating frequency. Different requirements apply to output matching because there are not relevant noise contributions that may originate from the output matching network. The matching is often achieved using resistive elements, and thereby with broadband characteristics.

Beside the above mentioned problem, the different gain and linearity specifications of each application dictate different design approaches for each amplifier. This often makes it impossible to not only share the same matching network, but even use the same active circuit.

When the gain and linearity requirements are linked to broad input dynamics, a typical approach is to make a variable gain amplifier. Though gain variation may address, to some extent, the linearity problems relative to the output section by attenuating the output signals, it does not resolve the linearity problems of the input section. The linearity problems of the input section are inherent to the nonlinear voltage-current characteristic of metal oxide semiconductor (MOS) transistors, as well as bipolar junction transistors (BJT).

Because the low-noise specification requirements must be met, a gain that is programmable in discrete steps, e.g., two or three steps, is usually preferred. Continuously programming over a broader dynamic range is usually applied to a variable gain amplifier (VGA) downstream of the mixer stage. An LNA circuit normally used to ensure the input matching and programmability of the gain is illustrated by the diagram of FIG. 1.

The current generator $I_{PTAT}$ and the current mirror $Q_1$–$Q_2$ establish the operating current in $Q_2$ to ensure stability in the gain when the temperature changes. A portion of the current signal, generated by $Q_2$, reaches the resistive load RL via $Q_3$. The portion of the current that flows in $Q_4$ is dispersed in the supply rail. Resistors $R_A$ and $R_B$ have the function of reducing the noise contribution originating from the bias network, and permits a simpler application of the signal through the coupling capacitor C.

The current signal on the load resistor depends on the voltage on the control terminal VC. If VC is much lower than $V_B$ ($V_B > V_C + 4V_T$), all the signal current of $Q_2$ goes to $Q_3$ and is converted to a voltage on the resistor $R_L$ producing the maximum gain. In the opposite case, if the VC voltage is greater than $V_B$ ($V_C > V_B + 4V_T$), the entire current flows in $Q_4$ and the gain is zero. By properly setting $V_C$ it is possible to obtain any gain value.

As mentioned above, to reduce the noise figure, the gain cannot be lowered below a minimum value. This requires an accurate control of the $V_C$ voltage. The practical aspect of a sufficiently accurate control is not easy because of the exponential voltage-current relation in the $Q_3$–$Q_4$ pair.

The inductors $L_E$ and $L_B$ in the circuit of FIG. 1 perform the impedance matching for the real part and the imaginary part of the input impedance, $Z_{in}$, respectively. By hypothesizing that $$\left(\frac{\omega \cdot \beta}{\omega_T}\right)^2 \gg 1,$$

the condition for the matching of the input impedance, $Z_{in}(jw)=R_s$, implies the selection of $L_E$ and $L_B$ values that satisfy the following equations:

$$\omega_T L_E + r_b \cong R_s \qquad (1)$$

$$\omega^2 \cdot (L_B + L_E) C_\pi \cong 1 \qquad (2)$$

The linearity of the voltage-to-current transformation through $Q_2$ is improved by the presence of $L_E$, which causes an emitter degeneration. Therefore, to improve the linearity in the presence of an ample input signal, $L_E$ is incremented. However, this is a detriment for matching of the real part of $Z_{in}$. An imperfect input impedance match for linearity is acceptable for signals having a sufficient magnitude.

SUMMARY OF THE INVENTION

An object of the present invention is to provide a low noise amplifier (LNA) for RF applications having a programmable selection of the operating frequency while ensuring an optimal combination of linearity and input matching characteristics, and having a selectable gain in a step mode for each selected configuration.

According to the present invention, the programmable LNA includes a selectable one of a number of selectable layouts of the amplifier's input stage, each defining an input matching circuit operating at a given RF frequency. A unique RF signal input inductor is selectively associated to an input coupling capacitor and to a second emitter or source degeneration inductor of a gain transistor of the input stage having a different value. The selection of a predetermined layout is operated with a plurality of switches through which a dedicated current generator is switchable on the programmably selected input stage. A bias current conducts through the selected input stage.

An input stage configured as a function of the operating frequency and of an optimizing combination of the input matching and linearity parameters is coupled to a respective output current buffer in which several transistors are driven by bias voltages whose value determines the selection of one of several predefined gain values.

DETAILED DESCRIPTION OF THE PREFERRED EMBODIMENTS

The following is a description of a low noise amplifier (LNA) whose gain and operating frequency are programmable in discrete steps. The circuit may be used for a variety of applications or for a certain application, which, as in the GSM case, requires accurate linearity in addition to low noise characteristics.

Figure 2:
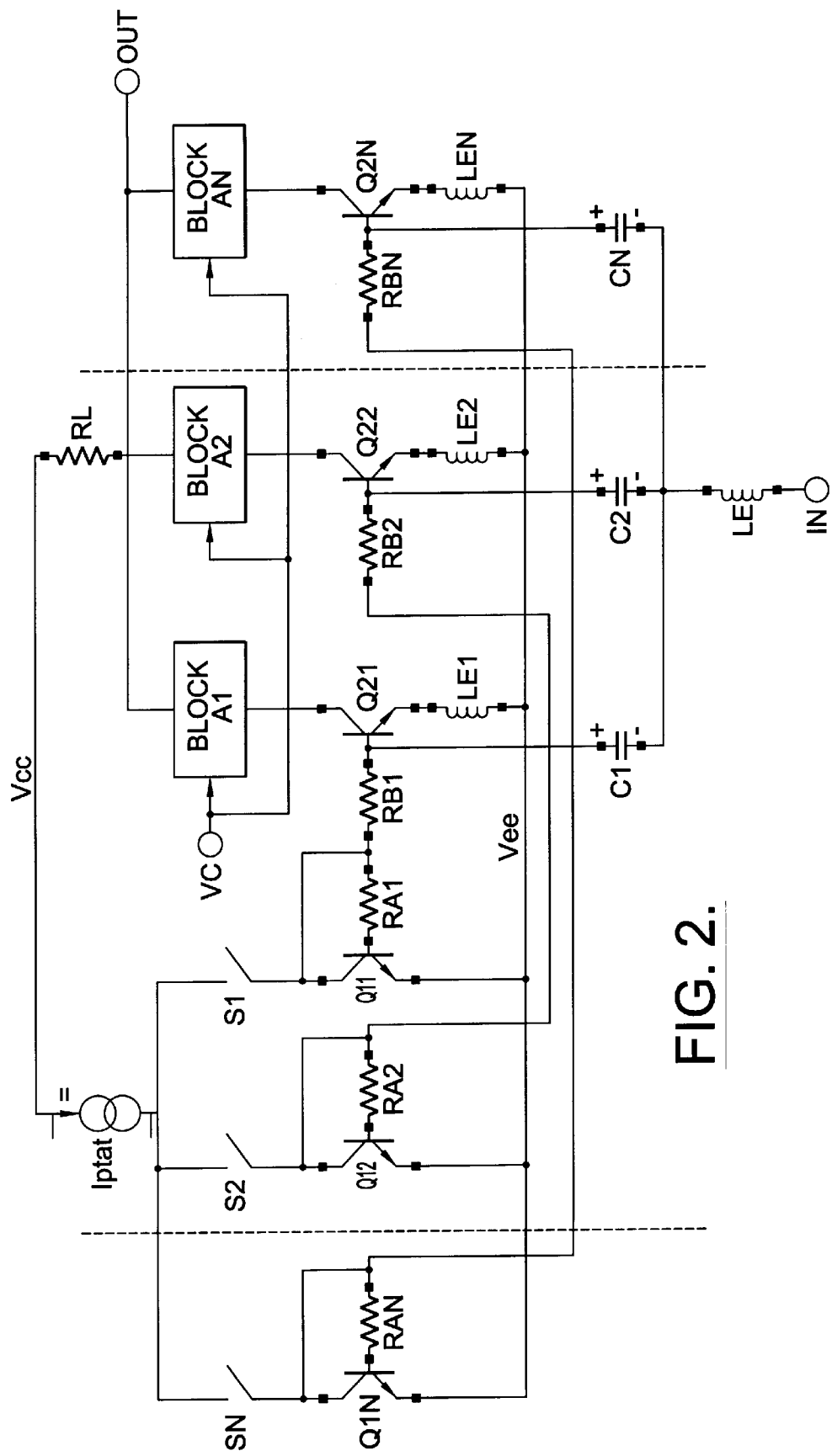
FIGS. 2a, 2b respectively show a functional scheme of a configurable low noise RF amplifier with bipolar transistors and with field effect transistors, according to the present invention.

By way of example, the circuit is formed with bipolar junction technology although the circuit of the present invention may be easily adapted to CMOS or BiCMOS technology. FIG. 2a illustrates an embodiment of the amplifier circuit of the invention using bipolar junction transistors (BJT). As previously stated, the circuit may also be formed with CMOS field effect transistors (FETS) as illustrated in FIG. 2b. The same references are used in both FIGS. 2a and 2b.

The circuit is generalized for a multi-standard application with N different operating frequencies. The transistors $Q_{21}$–$Q_{2N}$ are the gain elements of the selectively configurable input stages of the amplifier defined by the configuration switches $S_i$. The selected transistor $Q_{2i}$ is activated by a current mirror effect of the corresponding transistor $Q_{1i}$ of each pair of selected transistors.

Figure 1:
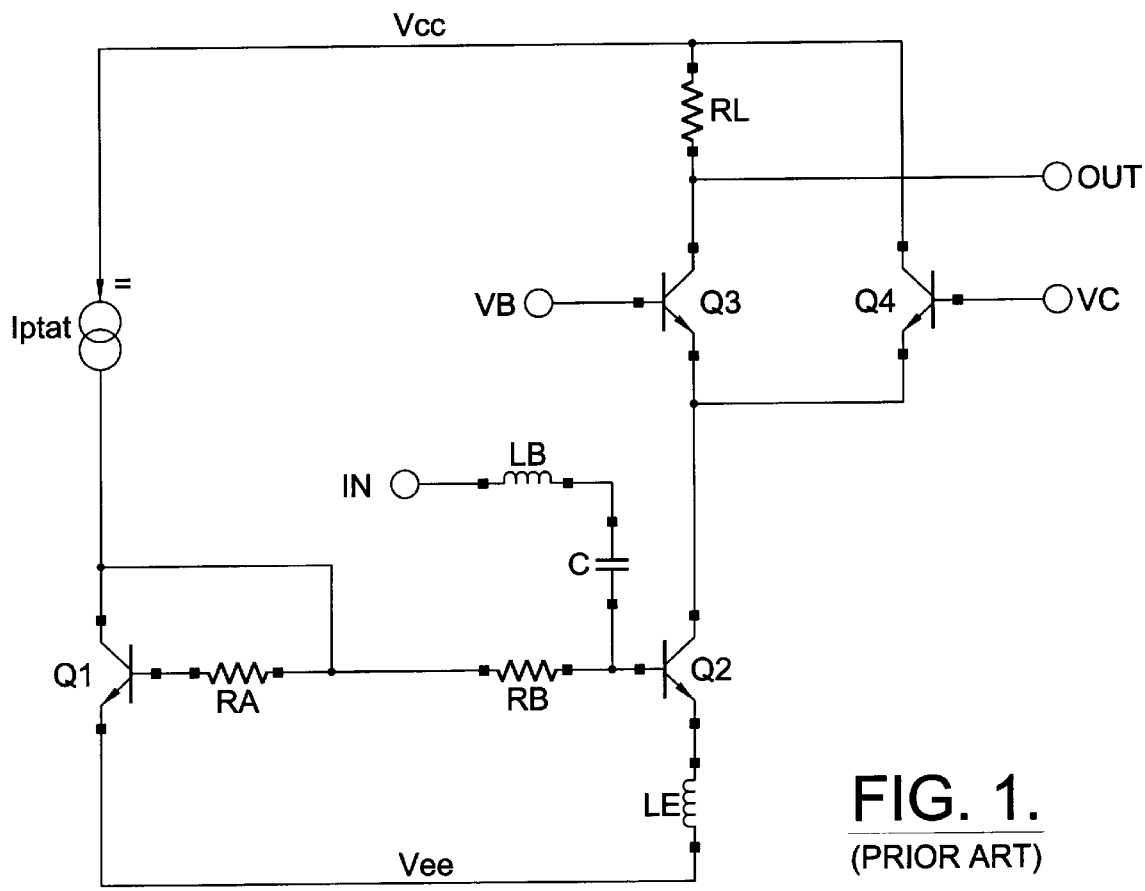
FIG. 1 shows a common circuit of a low noise RF amplifier with an input matching circuit and gain control stage, according to the prior art.

The resistors $R_{Ai}$ and $R_{Bi}$ have the same function of limiting the noise originating from the bias network of the common circuit shown in FIG. 1. The blocks $A_i$ are output current buffers whose gain may assume two different values depending on the value of the control voltage $V_C$. The resistor $R_L$ and the inductors $L_{Ei}$ have the same function as in the circuit of FIG. 1.

In particular, in the case of a low frequency input RF signal having high gain, wherein the linearity only depends on the output dynamics, the inductors $L_{Ei}$ may be equal and sized according to equation (1). This is not the case for the $L_B$ conductor and the capacitors $C_i$, because the match of the imaginary part depends on the specific operating frequency ω.

Assuming the circuit is used for a multi-standard application, for example, which requires a programmable match at different operating RF frequencies, the capacitors $C_i$ become part of the matching network. By assuming the activation of the i branch, equation (2) transforms to:

$$\omega^2 \cdot (L_B + L_{Ei}) \cdot \frac{C_\pi C_i}{C_\pi + C_i} \cong 1 \tag{3}$$

Once the values $L_{Ei}$ and $L_B$ are established, it is possible to select $C_i$ to obtain the match of the imaginary part at the desired frequency. The value of $L_B$ should be established with reference to the lower operating frequency, which requires the highest value of $L_B$. Therefore, it is possible to adapt the circuit to operate at different operating frequencies by adequately sizing the capacitors $C_i$ and by using a unique RF signal input inductor $L_B$.

The configurable circuit of the amplifier of the invention allows for simultaneously satisfying the requirement of operating at different frequencies, i.e., different standards, and with different signal levels having wide dynamics. With respect to the input part of the circuit, it is possible for a certain operating frequency to associate several branches with different inductances $L_{Ei}$ to be dynamically selected by the switches $S_i$, depending on the amplitude level of the input signal. For example, three branches may be associated for the GSM and additional three branches for the DCS.

A further functionality of the circuit is given by the particular implementation of the output current buffer of the various selectable input stages, represented by the $A_i$ blocks.

Figure 3:
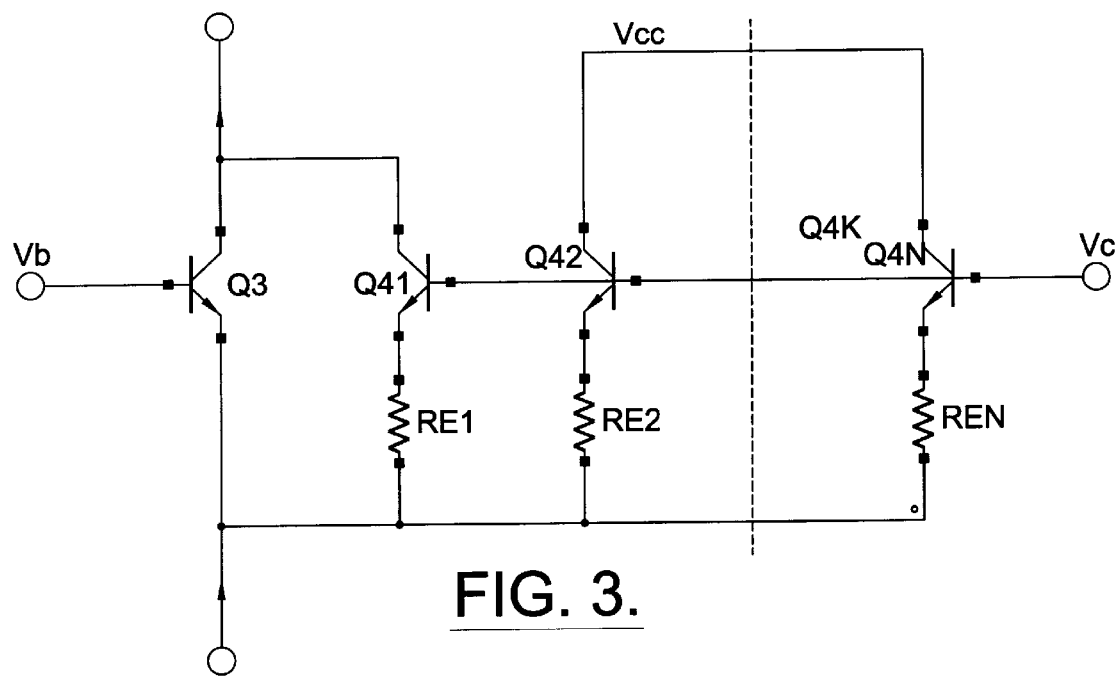
FIG. 3 shows a detail circuit of an output block of the scheme illustrated in FIG. 2.

As shown in FIG. 3, each output current buffer is formed by K+1 transistors and by K resistors. The resistors $R_{Ei}$ are introduced to more adequately match the $Q_{4i}$ transistors.

It is possible to set the maximum gain if $V_B > V_C 4V_T$, or any other gain value if $V_C$ is much greater than $V_B$ ($V_C > V_B 4V_T$). In the latter case, the gain value would depend on the number of branches of transistors $Q_{41}$–$Q_{4K}$ that have been connected to the output node. In the illustrated example of FIG. 3, only the branch of $Q_{41}$ is connected to the output node.

Each block $A_i$ defines two prefixed gain values. For example, the maximum gain and any other reduced gain value. Therefore, the blocks $A_i$ permit association of two different gains to the circuit selected by the switches $S_i$, carrying out an efficient programming function of the gain through accurate steps as required by many RF applications.

What is claimed is:

1. A low noise amplifier (LNA) comprising:
   a current generator providing a bias current;
   a plurality of input stages connected to said current generator, each input stage comprising a first transistor and a second transistor connected to said first transistor forming a current mirror;
   an input matching network connected in common to said plurality of input stages, said input matching network comprising a first inductor and a plurality of capacitors, each capacitor connected in common to said first inductor and to a respective input stage defining an operating frequency of the respective input stage;
   a plurality of output current buffers each having a selectable gain and being connected to a respective input stage; and
   a plurality of switches for selecting a respective output current buffer to receive the bias current to thereby select a gain.

2. A low noise amplifier (LNA) according to claim 1, wherein said first and second transistors each comprises a bipolar junction transistor; and wherein said second transistor is connected in a common-emitter configuration.

3. A low noise amplifier (LNA) according to claim 1, wherein said first transistor is connected to said current generator for providing the bias current to said second transistor when said respective switch is selected.

4. A low noise amplifier (LNA) according to claim 1, wherein said first and second transistors each comprises a metal oxide semiconductor field effect transistor.

5. A low noise amplifier (LNA) according to claim 1, wherein each input stage comprises a pair of noise limiting resistors connected in series between said first and second transistors.

6. A low noise amplifier (LNA) according to claim 1, wherein each input stage comprises an inductor connected between said first and second transistors.

7. A low noise amplifier (LNA) according to claim 1, wherein the bias current comprises a first and a second bias current; and wherein each output current buffer comprises:
   a third transistor forming an output node of the LNA and receiving the first bias current; and
   a plurality of fourth transistors connected together and receiving the second bias current, at least one of said fourth transistors being connected to said third transistor and others of said plurality of fourth transistors being connected to a voltage supply node of the LNA.

8. A low noise amplifier (LNA) according to claim 7, further comprising a plurality of degeneration resistors, each resistor connected between one of said plurality of fourth transistors and a respective input stage.

9. A low noise amplifier (LNA) according to claim 7, wherein said third and fourth transistors each comprises a bipolar junction transistor; and wherein said plurality of fourth transistors are connected in a common-emitter configuration; and wherein a collector of said at least one fourth transistor is connected to a collector of said third transistor.

10. A low noise amplifier (LNA) according to claim 7, wherein said third and said plurality of fourth transistors each comprises a metal oxide semiconductor field effect transistor.

11. A low noise amplifier (LNA) comprising:
a current generator providing a bias current;
a plurality of input stages connected to said current generator, each input stage comprising a first transistor and a second transistor connected to said first transistor forming a current mirror, and an inductor being connected between said first and second transistors;
an input matching network connected in common to said plurality of input stages, said input matching network comprising a first inductor and a plurality of capacitors, each capacitor connected in common to said first inductor and to a respective input stage defining an operating frequency of the respective input stage;
a plurality of output current buffers each having a selectable gain and being connected to a respective input stage; and
a plurality of switches for selecting a respective output current buffer to receive the bias current to thereby select a gain.

12. A low noise amplifier (LNA) according to claim 11, wherein said first and second transistors each comprises a bipolar junction transistor; and wherein said second transistor is connected in a common-emmitter configuration.

13. A low noise amplifier (LNA) according to claim 11, wherein said first transistor is connected to said current generator for providing the bias current to said second transistor when said respective switch is selected.

14. A low noise amplifier (LNA) according to claim 11, wherein said first and second transistors each comprises a metal oxide semiconductor field effect transistor.

15. A low noise amplifier (LNA) according to claim 11, wherein each input stage comprises a pair of noise limiting resistors connected in series between said first and second transistors.

16. A low noise amplifier (LNA) according to claim 11, wherein the bias current comprises a first and a second bias current; and wherein each output current buffer comprises:
a third transistor forming an output node of the LNA and receiving the first bias current; and
a plurality of fourth transistors connected together and receiving the second bias current, at least one of said fourth transistors being connected to said third transistor and others of said plurality of fourth transistors being connected to a voltage supply node of the LNA.

17. A low noise amplifier (LNA) according to claim 16, further comprising a plurality of degeneration resistors, each resistor connected between one of said plurality of fourth transistors and a respective input stage.

18. A low noise amplifier (LNA) according to claim 16, wherein said third and fourth transistors each comprises a bipolar junction transistor; and wherein said plurality of fourth transistors are connected in a common-emitter configuration; and wherein a collector of said at least one fourth transistor is connected to a collector of said third transistor.

19. A low noise amplifier (LNA) according to claim 16, wherein said third and said plurality of fourth transistors each comprises a metal oxide semiconductor field effect transistor.

20. A method for making a low noise amplifier (LNA) having a selectable gain, the method comprising the steps of:

providing a bias current using a current generator;
connecting a plurality of input stages to the current generator, each input stage comprising a first transistor and a second transistor connected to the first transistor forming a current mirror;
defining an operating frequency of each input stage using an input matching network, the input matching network being connected in common to the plurality of input stages, the input matching network comprising a first inductor and a plurality of capacitors, each capacitor connected in common to the first inductor and to a respective input stage for defining the operating frequency of the respective input stage;
connecting an output current buffer to a respective input stage, each output current buffer having a selectable gain; and
connecting a plurality of switches for selecting a respective output current buffer to receive the bias current to thereby select a gain.

21. A method according to claim 20, wherein the first and second transistors each comprises a bipolar junction transistor; and wherein the step of connecting a plurality of input stages comprises connecting the second transistor in a common-emitter configuration.

22. A method according to claim 20, wherein the first transistor is connected to the current generator for providing the bias current to the second transistor when the respective switch is selected.

23. A method according to claim 20, wherein the first and second transistors each comprises a metal oxide semiconductor field effect transistor.

24. A method according to claim 20, further comprising the step of connecting a pair of noise limiting resistors in series between the first and second transistors for each input stage.

25. A method according to claim 20, further comprising the step of connecting an inductor between the first and second transistors for each input stage.

26. A method according to claim 20, wherein the bias current comprises a first and a second bias current; and wherein the step of connecting an output current buffer to a respective input stage comprises:
using a third transistor for forming an output node of the LNA and for receiving the first bias current; and
connecting together a plurality of fourth transistors for receiving the second bias current, at least one of the fourth transistors being connected to the third transistor and others of the plurality of fourth transistors being connected to a voltage supply node of the LNA.

27. A method according to claim 26, further comprising the step of connecting a respective degeneration resistor between one of the plurality of fourth transistors and a respective input stage.

28. A method according to claim 26, wherein the third and fourth transistors each comprises a bipolar junction transistor; and wherein the step of connecting together the plurality of fourth transistors comprises connecting the plurality of fourth transistors in a common-emitter configuration, and connecting a collector of the at least one fourth transistor to a collector of the third transistor.

29. A method according to claim 26, wherein the third and the plurality of fourth transistors each comprises a metal oxide semiconductor field effect transistor.

* * * * *

UNITED STATES PATENT AND TRADEMARK OFFICE
CERTIFICATE OF CORRECTION

PATENT NO.      : 6,181,206 B1
DATED           : January 30, 2001
INVENTOR(S)     : Giuseppe Palmisano, Salvatore Pennisi It is certified that error appears in the above-identified patent and that said Letters Patent is hereby corrected as shown below:

Column 4,
Line 4, delete: "$V_B > V_C 4 V_T$" insert -- $V_B > V_C + 4 V_T$ --
Lines 5-6, delete: "$V_B(V_C > V_B 4 V_T)$" insert -- $V_B(V_C > V_B + 4 V_T)$ --

Signed and Sealed this

Fourth Day of December, 2001

Attest:

NICHOLAS P. GODICI
*Attesting Officer*   *Acting Director of the United States Patent and Trademark Office*